United States Patent
Hosaka et al.

(10) Patent No.: US 9,633,297 B2
(45) Date of Patent: Apr. 25, 2017

(54) IC MODULE, IC CARD, AND IC MODULE SUBSTRATE

(71) Applicant: TOPPAN PRINTING CO., LTD., Taito-ku, Tokyo (JP)

(72) Inventors: Kazuhiro Hosaka, Tokyo (JP); Seiji Yodokawa, Yamagata (JP); Shuji Ono, Yamagata (JP); Takehiko Moriya, Yamagata (JP)

(73) Assignee: TOPPAN PRINTING CO., LTD., Taito-Ku, Tokyo (JP)

( * ) Notice: Subject to any disclaimer, the term of this patent is extended or adjusted under 35 U.S.C. 154(b) by 0 days.

(21) Appl. No.: 15/030,687

(22) PCT Filed: Oct. 20, 2014

(86) PCT No.: PCT/JP2014/005305
§ 371 (c)(1),
(2) Date: Apr. 20, 2016

(87) PCT Pub. No.: WO2015/059915
PCT Pub. Date: Apr. 30, 2015

(65) Prior Publication Data
US 2016/0267371 A1 Sep. 15, 2016

(30) Foreign Application Priority Data
Oct. 22, 2013 (JP) .................................. 2013-219361

(51) Int. Cl.
*G06K 19/077* (2006.01)

(52) U.S. Cl.
CPC ... *G06K 19/0772* (2013.01); *G06K 19/07747* (2013.01); *H01L 2224/32225* (2013.01);
(Continued)

(58) Field of Classification Search
CPC .......... G06K 19/0772; G06K 19/07747; H01L 2224/32225; H01L 2224/48091;
(Continued)

(56) References Cited

U.S. PATENT DOCUMENTS

| 4,897,534 A * | 1/1990 | Haghiri-Tehrani | G06K 19/07718 235/488 |
| 5,055,913 A * | 10/1991 | Haghiri-Tehrani | G06K 19/07718 235/488 |
| 7,019,981 B2 * | 3/2006 | Heinemann | G06K 19/077 174/255 |

FOREIGN PATENT DOCUMENTS

| EP | 1249787 A1 | 10/2002 |
| JP | 2000-348154 A | 12/2000 |
| JP | 2002-312746 A | 10/2002 |

OTHER PUBLICATIONS

International Search Report and Written Opinion for Application No. PCT/JP2014/005305, Dec. 22, 2014, 6 pgs.
(Continued)

*Primary Examiner* — Sonji Johnson
(74) *Attorney, Agent, or Firm* — Squire Patton Boggs (US) LLP

(57) ABSTRACT

Provided are an IC module, an IC card, and an IC module substrate that can reduce the manufacturing cost without degrading the external appearance of a contact terminal. An IC module includes a contact terminal (10) provided on a front surface (1*a*) of a base member (1) and having a contact surface, for contact with an external terminal, formed of a gold plating layer (14); an IC chip (55) attached to a back surface (1*b*) of the base member (1); a conductive member (a wire (60), a first conductive layer (20), and a second conductive layer (30)) connecting the IC chip (55) and the contact terminal (10) to each other through a through hole (3) opened at the front surface (1*a*) and the back surface (1*b*)
(Continued)

of the base member (1); and an insulating surface material (40) partially covering the front surface (1*a*). At least a part of a region, overlapping the IC chip (55) in plan view, of the front surface (1*a*) is set as a non-forming region where a noble metal plating layer is not formed, and the surface material (40) is disposed in the non-forming region.

7 Claims, 17 Drawing Sheets

(52) U.S. Cl.
CPC .............. *H01L 2224/48091* (2013.01); *H01L 2224/48227* (2013.01); *H01L 2224/73265* (2013.01); *H01L 2924/181* (2013.01)

(58) Field of Classification Search
CPC . H01L 2224/48227; H01L 2224/73265; H01L 2924/181
See application file for complete search history.

(56) References Cited

OTHER PUBLICATIONS

International Preliminary Report on Patentabiilty with English Translation of the Written Opinion of the Int'l Searching Authority for Int'l Application No. PCT/JP2014/005305, Dec. 22, 2014, 6 pgs.

* cited by examiner

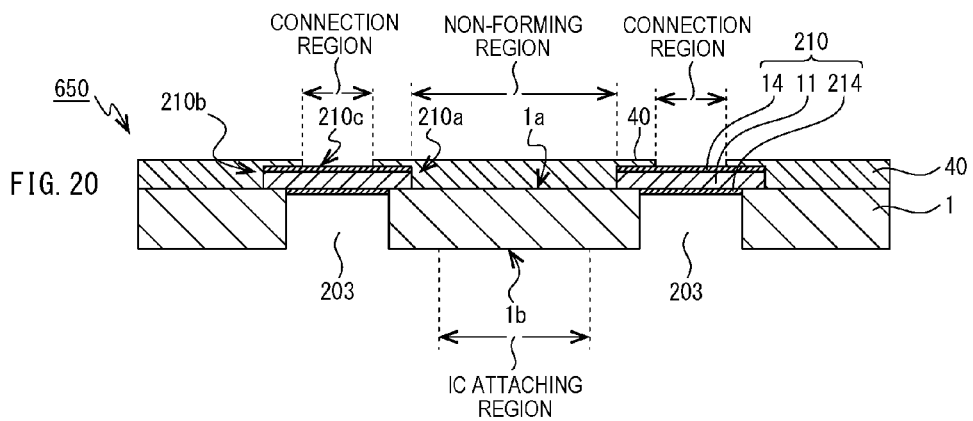
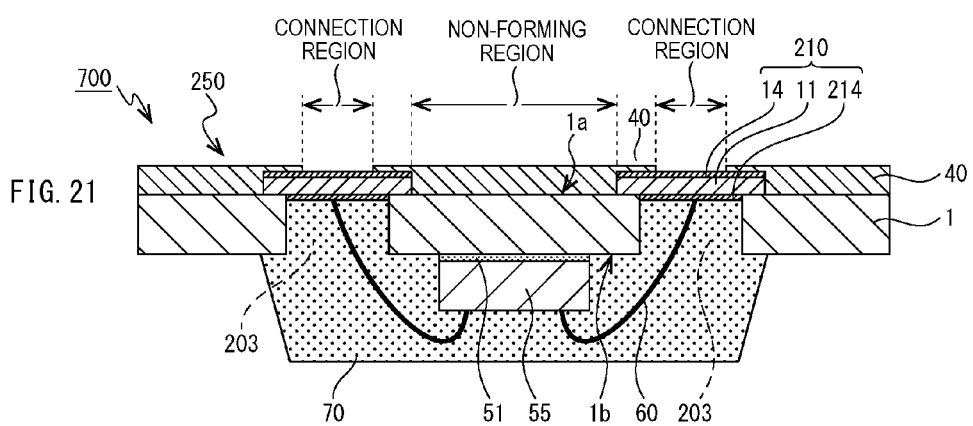
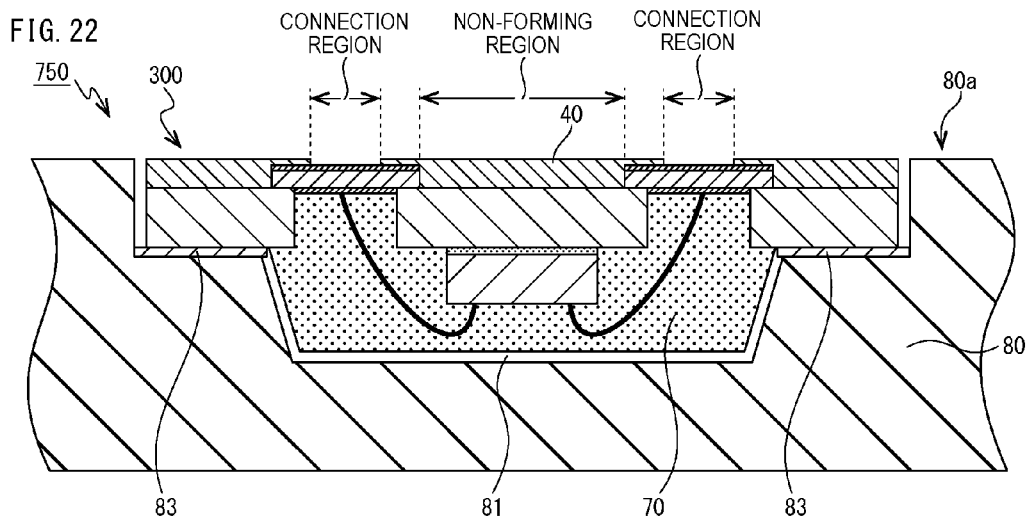

IC MODULE, IC CARD, AND IC MODULE SUBSTRATE

TECHNICAL FIELD

The present invention relates to an IC module, an IC card, and an IC module substrate and, in particular, relates to an IC module, an IC card, and an IC module substrate that can reduce the manufacturing cost without degrading the external appearance of a contact terminal.

BACKGROUND ART

Conventionally, in a contact-type IC card, use is made of an IC module of a structure in which an IC chip is mounted on an IC module substrate having contact terminals, the IC chip and the contact terminals are electrically connected to each other by wire bonding or the like, and the IC chip and wires are sealed with a sealing member resin. When mounting such an IC module on a card base member, a recess for embedding the IC module is provided in the card base member in advance and the IC module is embedded in this recess (see, e.g. PTL 1). It is known that the design is applied by providing a conductive printed layer and a transparent conductive protective layer in this order on a plating layer of the contact terminals (see, e.g. PTL 2).

FIG. 25 is a cross-sectional view illustrating a configuration example of an IC module 800 according to a prior art. As illustrated in FIG. 25, the IC module 800 is formed by mounting an IC chip 555 on an IC module substrate 501 having contact terminals 510, then electrically connecting connection regions of the contact terminals 510 and the IC chip 555 to each other by wires 560 through bonding holes 503, and then sealing the IC chip 555 and the wires 560 with a mold resin 570.

CITATION LIST

Patent Literature

PTL 1: JP 2002-312746 A
PTL 2: JP 2000-348154 A

SUMMARY OF INVENTION

Technical Problem

In the IC module 800 illustrated in FIG. 25, the contact terminal 510 includes a copper (Cu) foil 511, non-illustrated nickel (Ni) plating layers formed on the copper foil 511, and gold (Au) plating layers 514 and 524 provided on the nickel plating layers. Since a terminal (pin) of an IC card reader/writer (hereinafter RW), an ATM, or the like is brought into contact with the contact terminal 510, the gold plating is applied thereto in consideration of durability, corrosion resistance, appearance, and so on, but use of this gold plating has been a main factor to increase the manufacturing cost.

Herein, in order to reduce the manufacturing cost, it is considered to decrease the thickness of the gold plating layer 514. However, when the thickness of the gold plating layer 514 is decreased, the brightness of the contact terminal 510 is reduced. Further, there has been a problem that, by picking up (reflecting) slight unevenness of the IC module 800, traces of the bonding holes, traces of a heat pressing head when mounted on a card base member, and so on tend to appear so that the external appearance of an IC card tends to be impaired.

Therefore, the present invention has been made in view of such circumstances and has an object to provide an IC module, an IC card, and an IC module substrate that can reduce the manufacturing cost without degrading the external appearance of a contact terminal.

Solution to Problem

In order to solve the above-mentioned problem, one aspect of the present invention includes a contact terminal provided on a front surface of a base member and configured such that at least a part of a contact surface for contact with an external terminal is formed of a noble metal plating layer; an IC chip attached to a back surface of the base member; a conductive member connecting the IC chip and the contact terminal to each other through a through hole opened at the front surface and the back surface of the base member; and an insulating surface material partially covering the front surface of the base member. At least a part of a region, overlapping the IC chip in plan view, of the front surface is set as a non-forming region where the noble metal plating layer is not formed, and the surface material is disposed in the non-forming region.

Advantageous Effects of Invention

According to the one aspect of the present invention, at least apart of the region, overlapping the IC chip in plan view, of the front surface is set as the non-forming region where the noble metal plating layer is not formed, and the surface material is disposed in the non-forming region. Consequently, since the amount of use of a noble metal can be reduced without decreasing the thickness of the noble metal plating layer in the contact surface of the contact terminal, it is possible to reduce the manufacturing cost without degrading the external appearance of the contact terminal. Further, the side surface of the contact terminal is covered with the insulating surface material. Consequently, it is possible to prevent the side surface of the contact terminal from being exposed to a use environment and thus to prevent the occurrence of rust or the like on the side surface. Therefore, it is possible to improve the corrosion resistance of the contact terminal.

BRIEF DESCRIPTION OF DRAWINGS

FIG. 20 is a cross-sectional view illustrating a configuration example of an IC module substrate 650 according to a fourth embodiment;

FIG. 21 is a cross-sectional view illustrating a configuration example of an IC module 700 according to the fourth embodiment;

FIG. 22 is a cross-sectional view illustrating a configuration example of an IC card 750 according to the fourth embodiment;

DESCRIPTION OF EMBODIMENTS

Embodiments of the present invention will now be described with reference to the drawings. In the figures which will be described hereinbelow, portions having the same configuration will be assigned the same sign, thereby omitting repeated description thereof.

First Embodiment

Configuration

Figure 1:
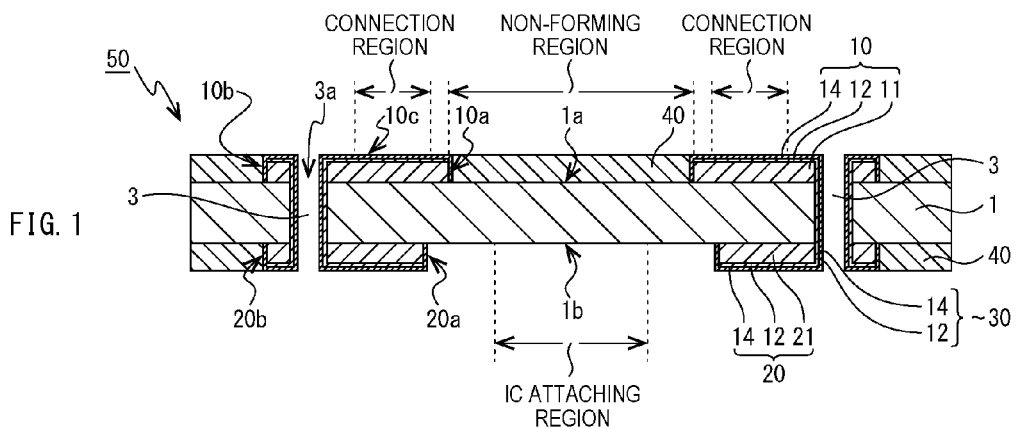
FIG. 1 is a cross-sectional view illustrating a configuration example of an IC module substrate 50 according to a first embodiment.

FIG. 1 is a cross-sectional view illustrating a configuration example of an IC module substrate 50 according to a first embodiment of the present invention. The IC module substrate 50 is a substrate for mounting an IC chip thereon to form an IC module. As illustrated in FIG. 1, the IC module substrate 50 includes a base member 1, contact terminals 10, first conductive layers 20, second conductive layers 30, and a surface material 40.

The base member 1 has a front (obverse) surface 1a and a back surface 1b. Through holes 3 being penetrating holes are provided between the front surface 1a and the back surface 1b of the base member 1. An IC attaching region for attaching the IC chip is prepared on the back surface 1b of the base member 1. While the material of the base member 1 is not particularly limited, the base member 1 is made of, for example, glass epoxy or polyimide. The thickness of the base member 1 is, for example, 80 μm or more and 170 μm or less.

The contact terminals 10 are provided on the front surface 1a of the base member 1. The contact terminal 10 has a structure in which a noble metal plating layer that serves as a contact surface with an external terminal (e.g. a terminal of an external device such as an IC card reader/writer or an ATM) is formed on a conductive material such as, for example, a copper (Cu) foil. In the first embodiment, side surfaces 10a and 10b and a contact surface 10c of the contact terminal 10 are formed of a noble metal plating layer.

To give an example, the contact terminal 10 includes a copper foil 11 being a conductive material, a copper plating layer 12 formed on the copper foil 11, a non-illustrated nickel (Ni) plating layer formed on the copper plating layer 12, and a gold (Au) plating layer 14 formed on the nickel plating layer. The gold plating layer 14 is one example of the noble metal plating layer. The side surfaces 10a and 10b and the contact surface 10c of the contact terminal 10 are formed of the gold plating layer 14.

The first conductive layers 20 are provided on the back surface 1b of the base member 1. The first conductive layer 20 has, for example, the same structure as the contact terminal 10. To give an example, the first conductive layer 20 includes a copper foil 21 being a conductive material, a copper plating layer 12 formed on the copper foil 21, a non-illustrated nickel plating layer formed on the copper plating layer 12, and a gold plating layer 14 formed on the nickel plating layer. A surface (lower surface in FIG. 1) and side surfaces 20a and 20b of the first conductive layer 20 are formed of the gold plating layer 14.

The second conductive layers 30 are provided on inner walls of the through holes 3. The second conductive layer 30 includes, for example, a copper plating layer 12, a non-illustrated nickel plating layer formed on the copper plating layer 12, and a gold plating layer 14 formed on the nickel plating layer.

The noble metal plating layers of the contact terminal 10, the first conductive layer 20, and the second conductive layer 30 are not limited to a gold plating layer. The noble metal plating layer may be, for example, a plating layer made of any one of silver (Ag), platinum (Pt), palladium (Pd), and so on.

The surface material 40, for example, partially covers the front surface 1a and the back surface 1b of the base member 1. To give an example, the surface material 40 covers regions, other than regions where the contact terminals 10 are disposed, of the front surface 1a of the base member 1. Further, the surface material 40 covers regions, other than regions where the first conductive layers 20 are disposed, of the back surface 1b of the base member 1. Further, the surface material 40 covers the side surfaces 10a and 10b, formed of the gold plating layer 14, of the contact terminals 10 and the side surfaces 20b, exposed from a sealing member 70, of the first conductive layers 20. In the contact surface 10c of the contact terminal 10, at least a part of a region exposed from the surface material 40 is a connection region for connection to the external terminal.

Herein, in the above description, as in FIG. 1, there is illustrated, by way of example, the case where no gap is provided between the contact terminal 10 and the surface material 40. A gap may be present between the contact terminal 10 and the surface material 40, but the gap is preferably as small as possible. Specifically, when a gap is formed, the gap is preferably 0.5 mm or less. When the gap is greater than 0.5 mm, there are cases where the corners formed by side walls, on the gap side, of the surface material 40 and the contact terminal 10 are rubbed and worn.

Part of the surface material 40 may be disposed to cover an outer peripheral portion of the contact terminal 10 as will be described later. In this case, however, the thickness of the surface material 40 at its covering portion (overlapping portion) is preferably small enough not to form a difference in level, specifically, preferably 10 µm or less.

The difference between the thickness of the surface material 40 (excluding the portion covering the contact terminal 10) and the thickness of the contact terminal 10 is satisfactorily 100 µm or less, preferably 50 µm or less, and more preferably 10 µm or less. When the difference in thickness is greater than 100 µm, a predetermined or greater level difference is formed, resulting in wearing of the corner at that level difference or the like, which is thus not preferable.

In the IC module substrate 50, at least a part of a region, overlapping the IC attaching region in plan view, of the front surface 1a is set as a non-forming region where no noble metal plating layer is formed. The surface material 40 is disposed in this non-forming region. The surface material 40 is not particularly limited in kind as long as it is an insulating material, and is made of, for example, a solder resist.

The color of the surface material 40 is also not particularly limited and may be, for example, a color different from the noble metal plating layer of the contact terminal 10 or the like (e.g. in the case of the gold plating layer, a color other than gold). In this case, it is also possible to further enhance the design properties of the external appearance of the contact terminal 10. This point will be described later.

Figure 2:
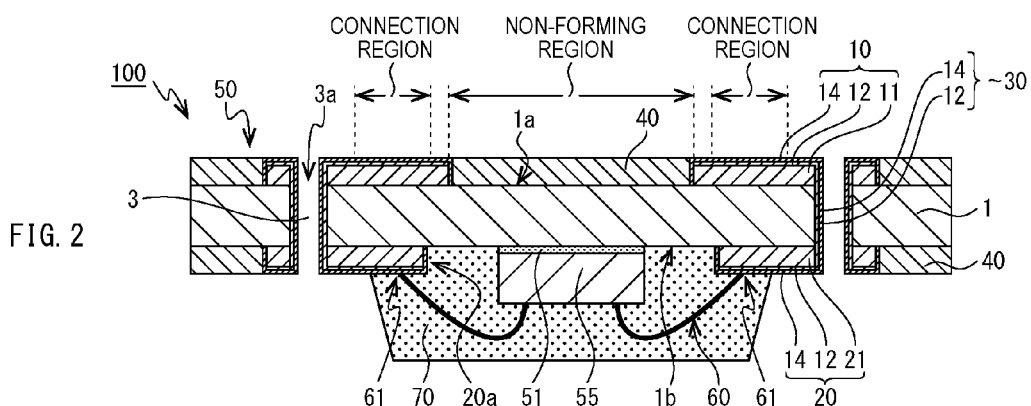
FIG. 2 is a cross-sectional view illustrating a configuration example of an IC module 100 according to the first embodiment.

FIG. 2 is a cross-sectional view illustrating a configuration example of an IC module 100 according to the first embodiment of the present invention. As illustrated in FIG. 2, the IC module 100 includes the IC module substrate 50, an IC chip 55 attached to the IC attaching region of the IC module substrate 50 via an adhesive 51, wires 60 electrically joining the IC chip 55 and the first conductive layers 20 to each other, and the sealing member 70 provided on the back surface 1b side of the IC module substrate 50 and sealing the IC chip 55, the wires 60, and part (including the side surface 20a) of each of the first conductive layers 20.

The IC chip 55 is manufactured by, for example, forming circuits in a silicon (Si) wafer, polishing this Si wafer to a prescribed thickness, and cutting off therefrom as one chip by a dicing device. The adhesive 51 is, for example, a silver (Ag) paste.

The wire 60 is for causing a non-illustrated electrode pad of the IC chip 55 to conduct with the contact terminal 10. One end of the wire 60 is joined to the non-illustrated electrode pad of the IC chip 55, while the other end of the wire 60 is joined to the gold plating layer 14 at the surface of the first conductive layer 20. The material of the wire 60 is, for example, gold. However, the material of the wire 60 is not limited to gold and may be another material such as, for example, copper or aluminum. The sealing member 70 is, for example, a mold resin formed by the transfer mold technique and is made of, for example, a thermoplastic resin, a thermosetting resin, an ultraviolet curable resin, or the like.

Figure 3:
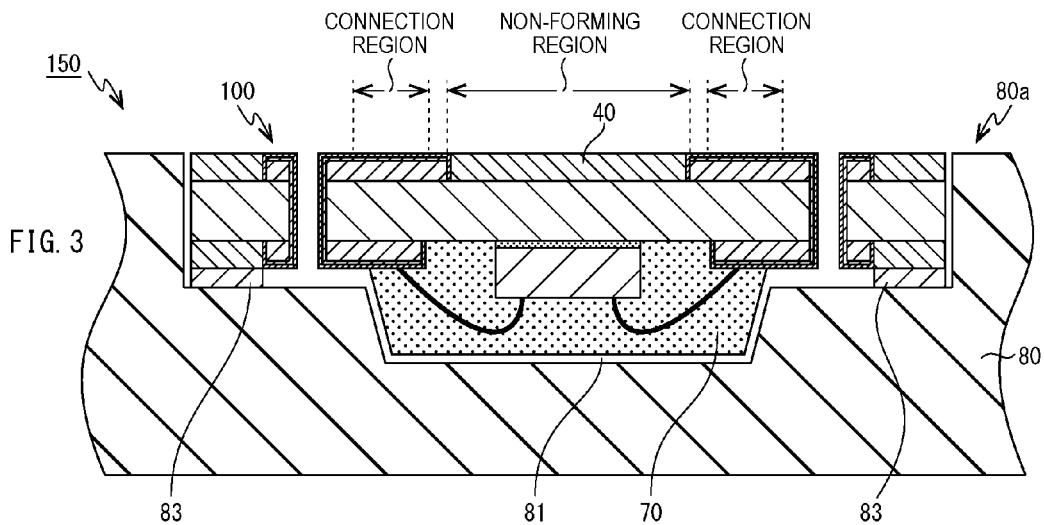
FIG. 3 is a cross-sectional view illustrating a configuration example of an IC card 150 according to the first embodiment.

FIG. 3 is a cross-sectional view illustrating a configuration example of an IC card 150 according to the first embodiment of the present invention. The IC card 150 illustrated in FIG. 3 is, for example, a contact-type IC card and includes a card base member 80 having a recess 81 on its card surface 80a and the IC module 100 embedded in the recess 81. In this example, the IC module 100 is disposed in the recess 81 in the state where its back surface side (i.e. the side having the sealing member 70) faces the card base member 80, and an outer peripheral portion of the IC module 100 is bonded and fixed to a bottom surface of the recess 81 via an adhesive 83.

In the state where the IC module 100 is embedded in the recess 81, its surface (e.g. a surface of the surface material 40) is flush with (i.e. at the same height as) the card surface 80a of the card base member 80. While the material of the card base member 80 is not particularly limited, the card base member 80 is made of, for example, an insulating resin material such as polyvinyl chloride (PVC) or polyethylene terephthalate (PET).

(Manufacturing Method)

FIGS. 4 to 6 are cross-sectional views illustrating, in the order of processes, a manufacturing method of the IC module 100 according to the first embodiment of the present invention. As illustrated in FIG. 4A, first, there is prepared a double-sided copper foil base member 2 in which copper foils 11 and 21 are respectively provided on a front surface 1a and a back surface 1b (i.e. both surfaces) of a base member 1. The copper foils 11 and 21 are bonded to the base member 1 by, for example, a non-illustrated adhesive.

Figure 4A:
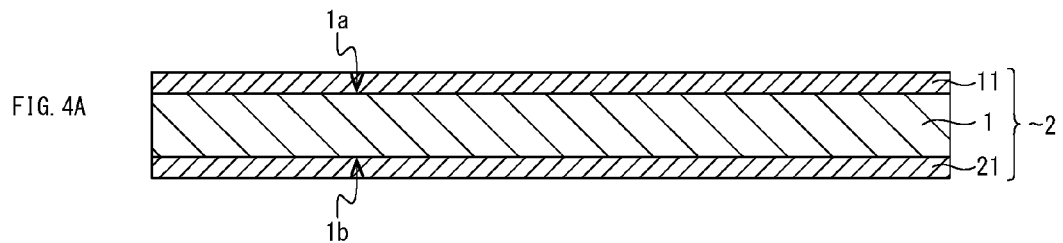
FIGS. 4A to 4D are cross-sectional views illustrating a manufacturing method of the IC module 100 in the order of processes.
Figure 4B:
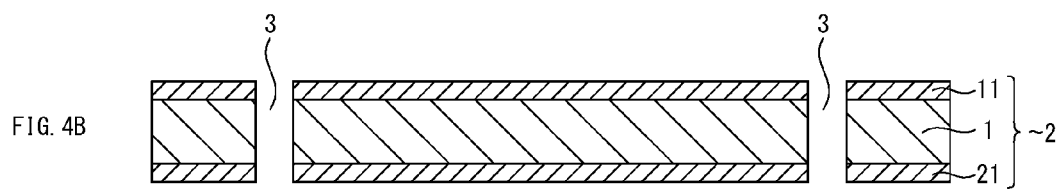

Then, as illustrated in FIG. 4B, through holes 3 being penetrating holes are formed in the double-sided copper foil base member 2. The through hole 3 is formed by, for example, drilling the double-sided copper foil base member 2 using a drill or irradiating laser light on the double-sided copper foil base member 2. Then, the double-sided copper foil base member 2 formed with the through holes 3 is exposed to, for example, a plasma atmosphere, thereby activating inner walls of the through holes 3. Consequently, resin residue or the like remaining on the inner walls in the formation of the through holes 3 is removed.

Figure 4C:
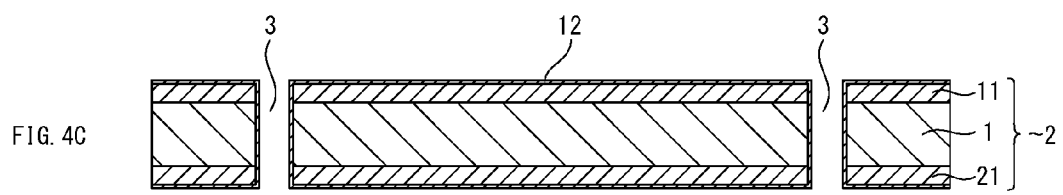

Then, as illustrated in FIG. 4C, a copper plating layer 12 is formed on the front surface 1a side and the back surface 1b side of the double-sided copper foil base member 2 and on the inner walls of the through holes 3 by, for example, electroplating. Herein, by the electroplating, the copper plating layer 12 is formed on surfaces of the copper foils 11 and 21 being conductors and is further formed on side surfaces of the copper foils 11 and 21 and over the inner walls of the through holes 3. By the copper plating layer 12, the copper foils 11 and 21 are in a state of conducting with each other via the through holes 3.

Figure 4D:
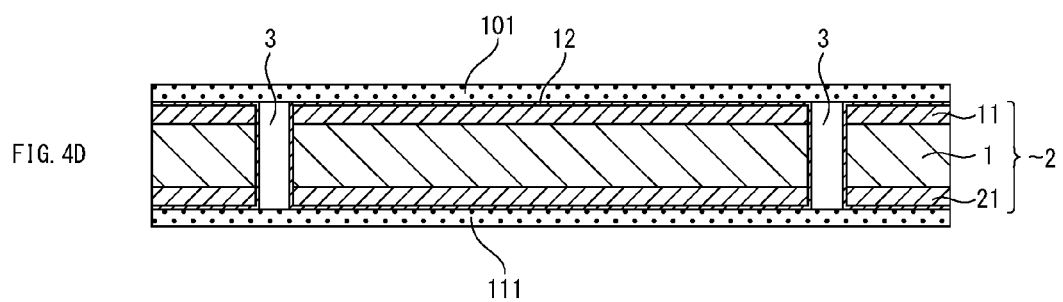
Figure 5A:
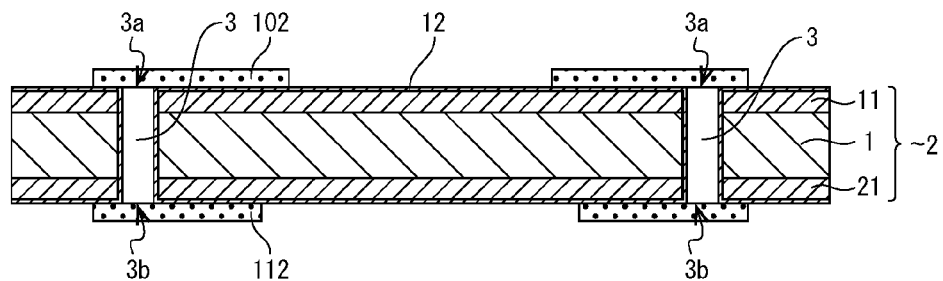
FIGS. 5A to 5C are cross-sectional views illustrating the manufacturing method of the IC module 100 in the order of processes.

Then, as illustrated in FIG. 4D, photoresists 101 and 111 are respectively applied to both surfaces of the double-sided copper foil base member 2. Then, the photoresists 101 and 111 are patterned by exposure and development techniques, thereby forming resist patterns 102 and 112, respectively, as illustrated in FIG. 5A. The shape of the resist pattern 102 is, for example, a shape that covers regions where contact terminals are to be formed and upper opening ends 3a of the through holes 3 and that exposes the other regions (e.g. a non-forming region). The shape of the resist pattern 112 is, for example, a shape that covers regions where first conductive layers 20 are to be formed and lower opening ends 3b of the through holes 3 and that exposes the other regions (e.g. an IC attaching region).

Figure 5B:
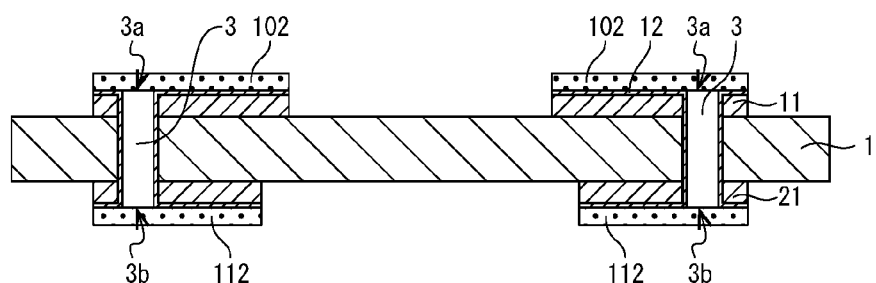
Figure 5C:
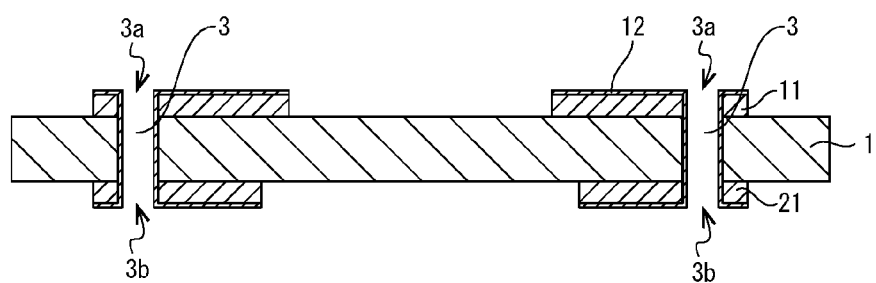

Then, using the resist patterns 102 and 112 as masks, the copper plating layer 12 and the copper foils 11 and 21 are etched in order. Consequently, as illustrated in FIG. 5B, the copper plating layer 12 and the copper foils 11 and 21 are left in regions where contact terminals are to be formed, regions where first conductive layers are to be formed, and regions where second conductive layers are to be formed, while the copper plating layer 12 and the copper foils 11 and 21 are removed in the other regions, thereby exposing the base member 1. Thereafter, as illustrated in FIG. 5C, the resist patterns are removed from both surfaces of the base member 1.

Figure 6A:
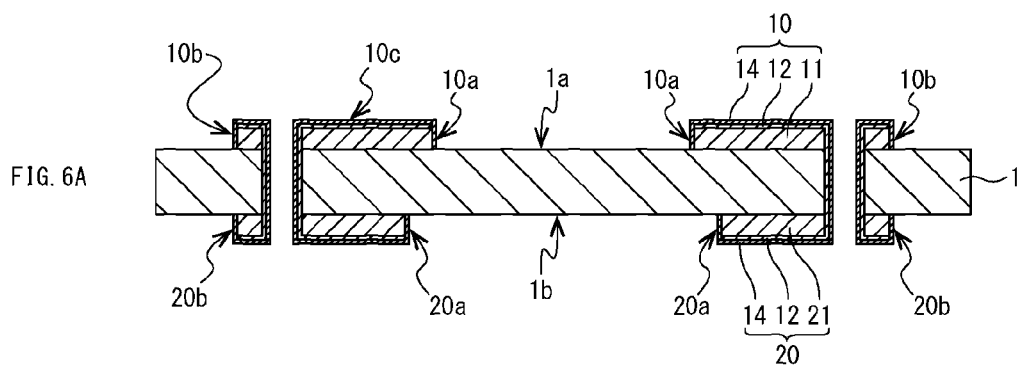
FIGS. 6A to 6C are cross-sectional views illustrating the manufacturing method of the IC module 100 in the order of processes.
Figure 6B:
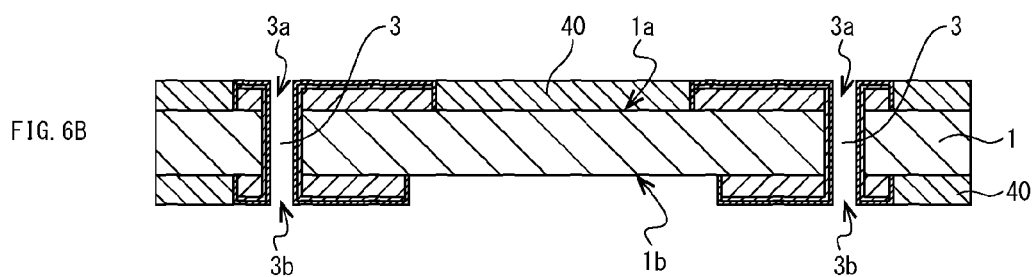

Then, a non-illustrated nickel plating layer and a gold plating layer 14 are formed on the copper plating layer 12 by, for example, electroplating. In this way, as illustrated in FIG. 6A, contact terminals 10, first conductive layers 20, and second conductive layers 30 are formed. Then, as illustrated in FIG. 6B, an insulating surface material 40 is applied to both surfaces of the base member 1. An application method (i.e. a forming method) of the surface material 40 is, for example, printing (offset printing, screen printing). Alternatively, a forming method of the surface material 40 may be a method other than printing and may be, for example, vapor deposition or the like. A transparent layer may be formed as a protective member on the surface material 40. Through the processes described above, the IC module substrate 50 illustrated in FIG. 1 is completed.

Figure 6C:
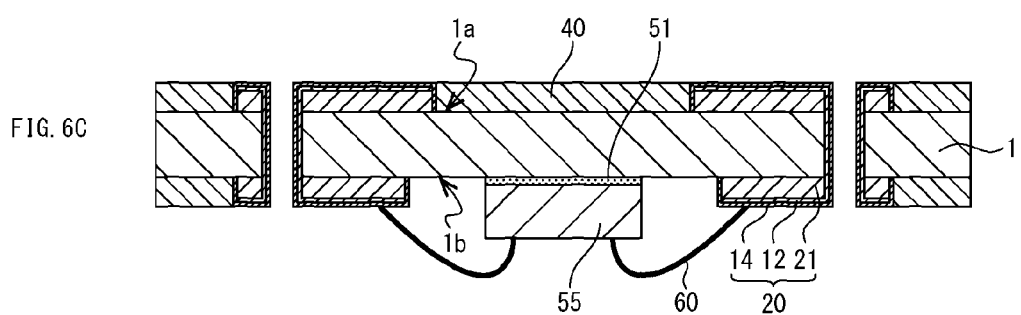

Then, as illustrated in FIG. 6C, an IC chip 55 is attached to the IC attaching region of the IC module substrate 50 using an adhesive 51 such as an Ag paste (mounting process). After the mounting process, one end of each wire 60 is joined to a pad electrode of the IC chip 55 and the other end of each wire 60 is joined to the gold plating layer 14 at the surface of the first conductive layer 20, thereby electrically connecting the IC chip 55 and the first conductive layers 20 to each other (wire bonding process). After the wire bonding process, a sealing member is formed on the back surface 1b side of the base member 1, thereby sealing the IC chip 55, the wires 60, and part of each of the first conductive layers 20 (sealing process). In the sealing process, the sealing member is formed by, for example, a transfer mold method, a potting method, printing, or the like. Through the processes described above, the IC module 100 illustrated in FIG. 2 is completed.

Subsequently, in manufacturing processes of the IC card 150, there is prepared a card base member 80 having a recess 81 (see, e.g. FIG. 3). The recess 81 is formed by, for example, cutting a card surface 80a using an end mill. Then, an adhesive 83 is applied to at least one of the IC module 100 and a bottom surface of the recess 81 in advance (see, e.g. FIG. 3) and then the IC module 100 is disposed in the recess 81 using, for example, a pickup device or the like and is hot-pressed. Through the processes described above, the IC card 150 illustrated in FIG. 3 is completed.

In the first embodiment, the first conductive layer 20, the second conductive layer 30, and the wire 60 correspond to a "conductive member" of the present invention. Further, the wire 60 corresponds to a "conductive path" of the present invention. Further, the card surface 80a corresponds to "one surface" of the present invention.

Effects of First Embodiment

The first embodiment of the present invention exhibits the following effects.

(1) In the contact terminal 10, at least a part of the contact surface 10c and the side surfaces 10a and 10b are formed of the gold plating layer 14 (i.e. at least a part of the contact surface 10c and the side surfaces 10a and 10b of the contact terminal 10 are set as forming regions where the noble metal plating layer is formed). Further, at least a part of a region, overlapping the IC chip 55 (or the IC attaching region) in plan view, of the front surface 1a of the base member 1 is set as a non-forming region where no noble metal plating layer is formed, and the surface material 40 is disposed in the non-forming region.

For example, at a terminal position prescribed by the ISO or JIS standard, the contact terminal 10 having the gold plating layer 14 is disposed, while, at a position other than that, the surface material 40 is disposed instead of the gold plating layer. Consequently, since the amount of use of gold can be reduced without decreasing the thickness of the gold plating layer 14 in the contact terminal 10, it is possible to reduce the manufacturing cost of the IC module substrate, the IC module, and the IC card without degrading the external appearance of the contact terminal.

(2) The side surfaces 10a and 10b of the contact terminal 10 are covered with the surface material 40. Consequently, the side surfaces 10a and 10b of the contact terminal 10 can be prevented from being exposed to a use environment. In the first embodiment, the side surfaces 10a and 10b are each formed of the gold plating layer 14 and further the side surfaces 10a and 10b are each covered with the surface material 40. That is, the side surfaces of the copper foil 11 forming the contact terminal 10 are covered doubly with the gold plating layer 14 and the surface material 40. Consequently, it is possible to prevent the occurrence of rust or the like on the side surfaces of the copper foil 11 forming the contact terminal 10. This also applies to the side surface 20b, exposed from the sealing member 70, of the first conductive layer 20. Therefore, it is possible to enhance the corrosion resistance of the contact terminal and so on. Further, by forming the surface material 40 partially on the front surface 1a of the base member 1, the design properties of the front surface 1a can also be ensured.

Figure 7A:
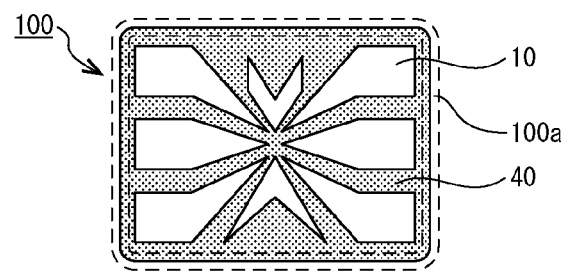
FIGS. 7A to 7C are plan views each illustrating an example of the external appearance of the IC module 100.
Figure 7B:
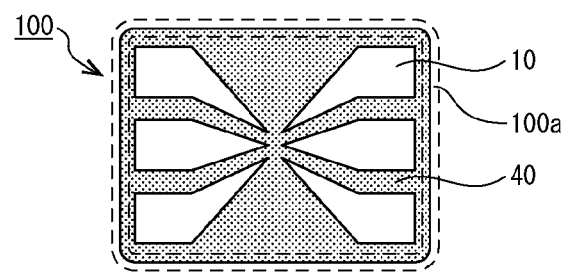
Figure 7C:
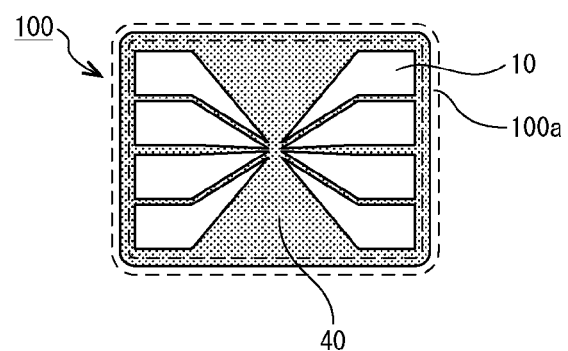

FIGS. 7A to 7C are plan views each exemplarily illustrating an example of the IC module 100. FIGS. 7A and 7B respectively illustrate examples of 6 terminals, while FIG. 7C illustrates an example of 8 contact terminals 10 (i.e. 8 terminals). In any of these cases, since copper or the like is not exposed at outer peripheral sections (side surfaces) 100a of the IC module 100, it is possible to prevent the progress of corrosion.

(3) The color of the surface material 40 is preferably a color different from the gold plating layer (i.e. a color other than gold). For example, as the color other than gold, there can be cited black, gray, white, red, blue, or the like. Consequently, using the difference in color between the gold plating layer 14 and the surface material 40, it is possible to highlight the external appearance of the contact terminal 10. Therefore, it is possible to realize IC module substrates, IC modules, and IC cards with high design properties having various variations in the color and shape of contact terminals. For example, in FIG. 7A to 7C, it is possible to realize the contact terminals 10 with high design properties due to the difference in color between the contact terminals 10 and the surface material 40.

(4) It is not necessary to extend the other end of the wire 60 to the through hole 3. Consequently, the length of the wire 60 can be shortened so that the sealing member 70 sealing the wires 60 can be reduced in size. Therefore, it is possible to contribute to the improvement in the strength of the sealing member 70 (i.e. when the sealing member is small, a force acting between one end and the other end of the sealing member becomes small so that a crack or the like is difficult to occur in the sealing member).

(5) One end of the wire 60 is joined to the IC chip 55, while the other end thereof is joined to the first conductive layer 20 provided on the back surface 1b of the base member. Consequently, by changing the layout of the first conductive layers 20 in the design stage of the IC module substrate 50, the positions of joining portions 61 between the other ends of the wires 60 and the first conductive layers 20 can be adjusted.

Figure 8A:
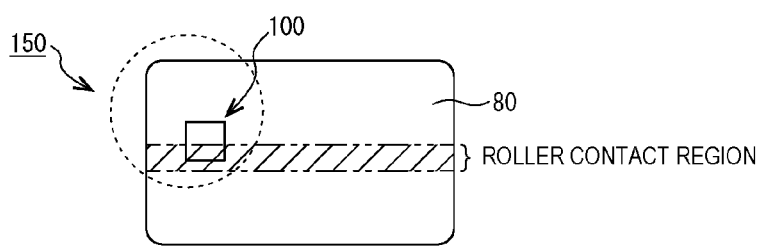
FIGS. 8A and 8B are plan views exemplarily illustrating a roller contact region in the IC card 150.
Figure 8B:
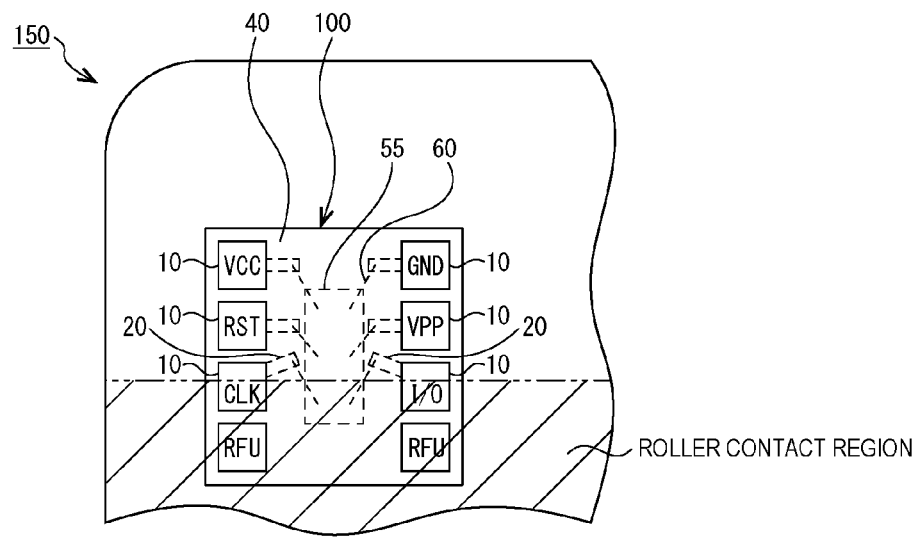

FIGS. 8A to 8B are plan views exemplarily illustrating a roller contact region, that is brought into contact with an external roller (e.g. a roller for IC card insertion and removal in an external device such as a RW or an ATM), in the card surface 80a of the card base member 80. FIG. 8A illustrates the whole of the IC card 150, while FIG. 8B is a diagram illustrating, on an enlarged scale, a portion encircled by a broken line in FIG. 8A. In the IC module 100 illustrated in FIG. 8B, Vcc represents a connection region for circuit voltage supply, GND a connection region for ground potential supply, RST a connection region for reset signal input, Vpp a connection region for writing voltage supply, CLK a connection region for clock signal input, I/O a connection region for data signal input/output, and RFU a connection region for future use (i.e. spare).

For example, as illustrated in FIG. 8A, it is assumed that the roller contact region overlaps the IC module 100 in the IC card 150. In such a case, for example, as illustrated in FIG. 8B, the layout of the first conductive layers 20 is changed such that the joining portions between the wires 60 and the first conductive layers 20, where the joining strength is considered to be relatively weak, are adjusted so as to be located outside the roller contact region. Consequently, the joining portions between the wires 60 and the first conductive layers 20 can be prevented from being pressed by the transfer roller so that the reliability of the joining portions can be kept high.

(6) Even when the joining portions between the wires 60 and the first conductive layers 20 overlap the roller contact region, the joining portions between the wires 60 and the first conductive layers 20 are on the back surface 1b side of the base member 1 and thus are pressed by the transfer roller via the base member 1. Therefore, the reliability is high compared to a case where the joining portions are arranged on the front surface 1a side of the base member 1.

(Modifications)

(1) In the first embodiment described above, the description is given of the case where the electrical connection between the IC chip 55 and the first conductive layer 20 is carried out via the wire 60 (i.e. carried out by wire bonding). However, in the first embodiment of the present invention, the electrical connection between the IC chip 55 and the first conductive layer 20 is not limited to the wire 60 and may be carried out, for example, via bump electrodes (i.e. may be carried out by face-down bonding). Even in such a case, the effects (1) to (4) of the first embodiment described above are exhibited.

(2) In the first embodiment described above, the description is given of the case where the contact surface 10c of the contact terminal 10 is completely exposed from the surface material 40. However, the present invention is not limited thereto. The surface material 40 may cover at least a part of a region, other than the connection region, of the contact surface 10c. Even in such a case, the effects (1) to (6) of the first embodiment described above are exhibited. It is possible to further contribute to ensuring the design properties of the front surface 1a.

(3) In the first embodiment described above, the description is given of the case where the inner wall of the through hole 3 and the upper opening end 3a and the lower opening end 3b of the through hole 3 are not covered with the surface material 40. However, the present invention is not limited thereto. The surface material 40 may cover at least one or more of the inner wall of the through hole 3 and the upper opening end 3a and the lower opening end 3b of the through hole 3. The surface material 40 may cover the inside of the through hole 3. Even in such a case, the effects (1) to (6) of the first embodiment described above are exhibited. It is possible to further contribute to ensuring the design properties of the front surface 1a.

Second Embodiment

In the first embodiment described above, the description is given of the case where the side surfaces of the contact terminal are formed of the noble metal plating layer. However, the present invention is not limited thereto. The side surfaces of the contact terminal may be, for example, the base material (e.g. copper) of the contact terminal. This point will be described in a second embodiment.

(Configuration)

Figure 9:
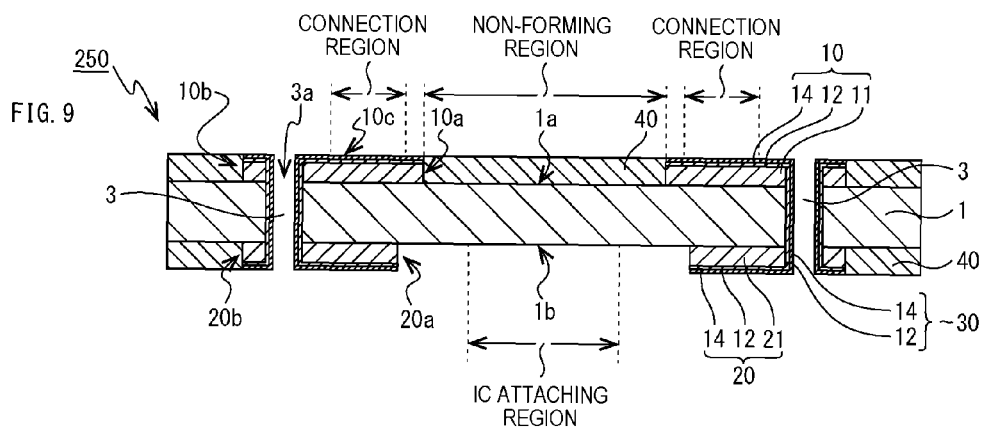
FIG. 9 is a cross-sectional view illustrating a configuration example of an IC module substrate 250 according to a second embodiment.
Figure 10:
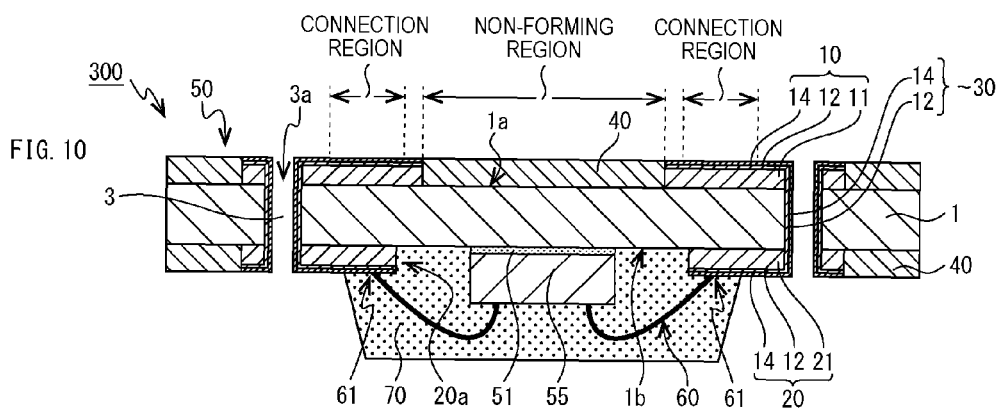
FIG. 10 is a cross-sectional view illustrating a configuration example of an IC module 300 according to the second embodiment.
Figure 11:
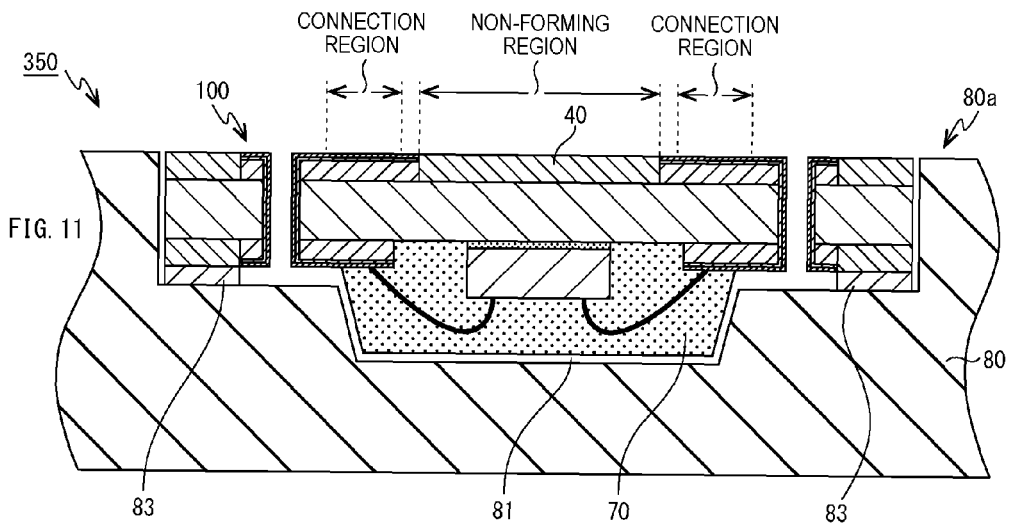
FIG. 11 is a cross-sectional view illustrating a configuration example of an IC card 350 according to the second embodiment.

FIG. 9 is a cross-sectional view illustrating a configuration example of an IC module substrate 250 according to the second embodiment of the present invention. FIG. 10 is a cross-sectional view illustrating a configuration example of an IC module 300 according to the second embodiment of the present invention. FIG. 11 is a cross-sectional view illustrating a configuration example of an IC card 350 according to the second embodiment of the present invention.

As illustrated in FIGS. 9 to 11, the IC module substrate 250, the IC module 300, and the IC card 350 according to the second embodiment differ from the IC module substrate 50, the IC module 100, and the IC card 150 according to the first embodiment in that side surfaces 10a and 10b of a contact terminal 10 and side surfaces 20a and 20b of a first conductive layer 20 are exposed from a noble metal plating layer. For example, the side surfaces 10a and 10b of the contact terminal 10 and the side surfaces 20a and 20b of the first conductive layer 20 are not a gold plating layer 14, but are respectively side surfaces of copper foils 11 and 21 and are made of copper. These side surfaces 10a, 10b, 20a, and 20c made of copper are covered with a surface material 40. The other structures of the second embodiment are the same as those of the first embodiment.

(Manufacturing Method)

Figure 12A:
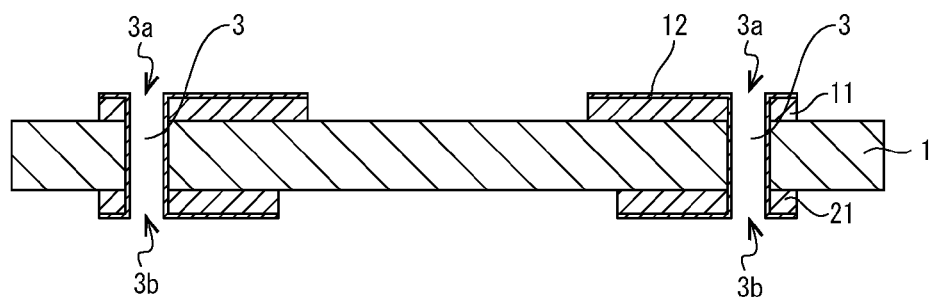
FIGS. 12A to 12C are cross-sectional views illustrating a manufacturing method of the IC module 300 in the order of processes.

FIGS. 12 and 13 are cross-sectional views illustrating, in the order of processes, a manufacturing method of the IC module 300 according to the second embodiment of the present invention. As illustrated in FIG. 12A, processes up to processes of partially etching a copper plating layer 12 and copper foils 11 and 21 and removing resists thereafter are the same as those in the first embodiment.

Figure 12B:
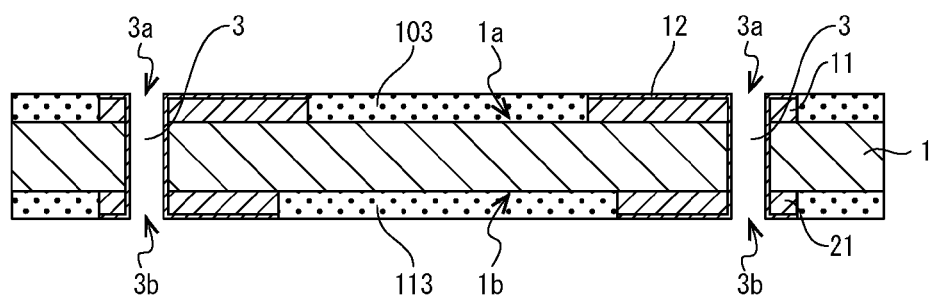

Then, as illustrated in FIG. 12B, a resist pattern 103 is formed in regions, exposed from the copper foil 11, of a front surface 1a of a base member 1. Further, before or after the formation of the resist pattern 103, a resist pattern 113 is formed in regions, exposed from the copper foil 21, of a back surface 1b of the base member 1. The resist pattern 103 has, for example, a shape that exposes regions where contact terminals are to be formed and upper opening ends 3a of through holes 3 and that covers the other regions (e.g. a space etc.). The resist pattern 113 has a shape that exposes regions where first conductive layers are to be formed and lower opening ends 3b of the through holes 3 and that covers the other regions (e.g. an IC attaching region). A forming method of the resist patterns 103 and 113 is, for example, printing (offset printing, screen printing) of a resist material or application of a resist material and exposure and development techniques.

Figure 12C:
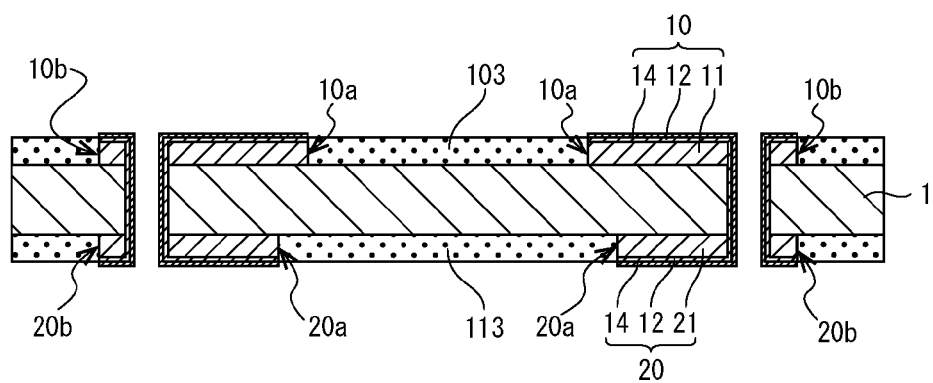
Figure 13A:
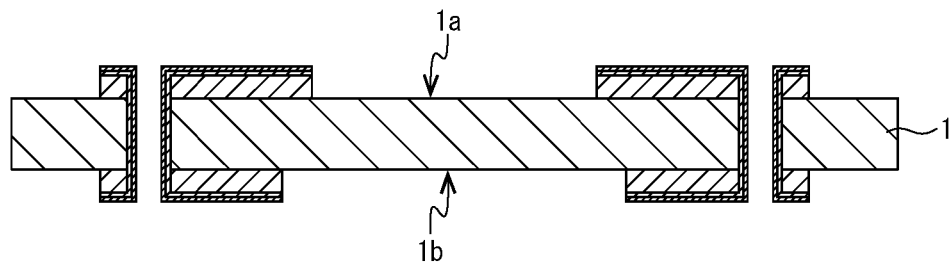
FIGS. 13A to 13C are cross-sectional views illustrating the manufacturing method of the IC module 300 in the order of processes.

Then, a nickel plating layer and a gold plating layer 14 are formed by, for example, electroplating. As illustrated in FIG. 12C, since side surfaces 10a and 10b of contact terminals 10 are covered with the resist 103 and side surfaces 20a and 20b of first conductive layers 20 are covered with the resist 113, the nickel plating layer or the gold plating layer 14 is not formed on these side surfaces 10a, 10b, 20a, and 20b. That is, the side surfaces 10a, 10b, 20a, and 20b are made of copper. Then, as illustrated in FIG. 13A, the resists 103 and 113 are removed from the base member 1.

Figure 13B:
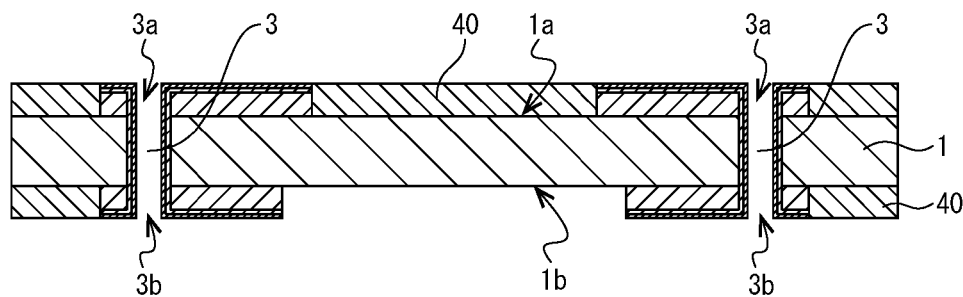
Figure 13C:
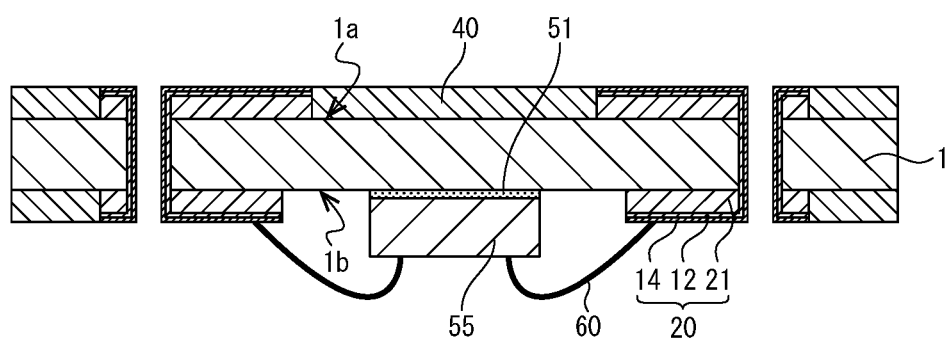

Then, subsequent processes are the same as those in the first embodiment. That is, as illustrated in FIG. 13B, an insulating surface material 40 is applied to both surfaces of the base member 1. Consequently, the IC module substrate 250 illustrated in FIG. 9 is completed. Then, as illustrated in FIG. 13C, a mounting process of an IC chip 55, a wire bonding process, and a sealing process are carried out in this order. Through the processes described above, the IC module 300 illustrated in FIG. 10 is completed.

The correspondence relationship with the present invention in the second embodiment is the same as that in the first embodiment.

Effects of Second Embodiment

The second embodiment of the present invention exhibits the same effects as the effects (1) and (3) to (6) of the first embodiment.

In the second embodiment, the surface material 40 covers the side surfaces 10a and 10b made of, for example, copper. Consequently, the side surfaces 10a and 10b of the contact terminal 10 can be prevented from being exposed to a use environment so that it is possible to prevent the occurrence of rust or the like on the side surfaces 10a and 10b. This also applies to the side surface 20b, exposed from a sealing member 70, of the first conductive layer 20. Therefore, it is possible to enhance the corrosion resistance of the contact terminal 10 and so on.

(Modifications)

The modifications (1) to (3) described in the first embodiment may also be applied to the second embodiment.

Third Embodiment

In the first embodiment described above, the description is given of the case where the double-sided copper foil base member in which the copper foils are respectively provided on the front surface and the back surface is used as the base member of the IC module substrate. However, in the embodiment of the present invention, the base member of the IC module substrate is not limited to the double-sided copper foil base member and may be, for example, a single-sided copper foil base member in which a copper foil is provided on only one of a front surface and a back surface. In a third embodiment, such a case will be described.

(Configuration)

Figure 14:
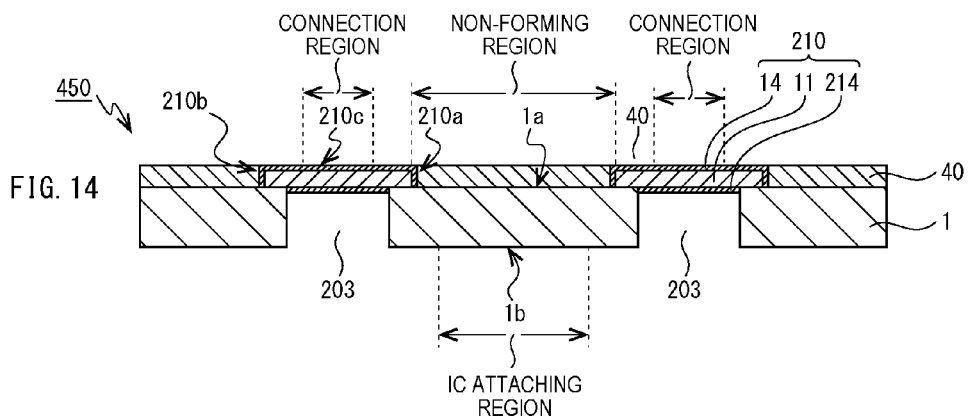
FIG. 14 is a cross-sectional view illustrating a configuration example of an IC module substrate 450 according to a third embodiment.

FIG. 14 is a cross-sectional view illustrating a configuration example of an IC module substrate 450 according to the third embodiment of the present invention. As illustrated in FIG. 14, the IC module substrate 450 includes a base member 1, contact terminals 210, and a surface material 40.

The contact terminals 210 are provided on a front surface 1a of the base member 1. The contact terminal 210 has a structure in which noble metal plating such as gold plating is applied to a conductive material such as, for example, a copper (Cu) foil. To give an example, the contact terminal 210 includes a copper foil 11 being a conductive material, a non-illustrated nickel (Ni) plating layer formed on a front surface and side surfaces of the copper foil 11, and a gold plating layer 14 formed on the front surface side of the copper foil 11 via the nickel plating layer. Further, the contact terminal 210 includes a gold plating layer 214 formed on its back surface in a region facing a bonding hole 203 being a through hole.

The gold plating layer 14 of the contact terminal 210 is a noble metal plating layer that serves as a contact surface 210c for contact with an external terminal. The gold plating layer 214 of the contact terminal 210 is a noble metal plating layer to which the other end of a wire is joined. The noble metal plating layer of the contact terminal 210 is not limited to a gold plating layer and may be, for example, a plating layer made of anyone of silver (Ag), platinum (Pt), palladium (Pd), and so on.

The surface material 40 covers regions, other than regions where the contact terminals 210 are disposed, of the front surface 1a of the base member 1. To give an example, the surface material 40 covers a non-forming region, where no noble metal plating layer is formed, of the front surface 1a of the base member 1 and also covers side surfaces 210a of the contact terminals 210.

Figure 15:
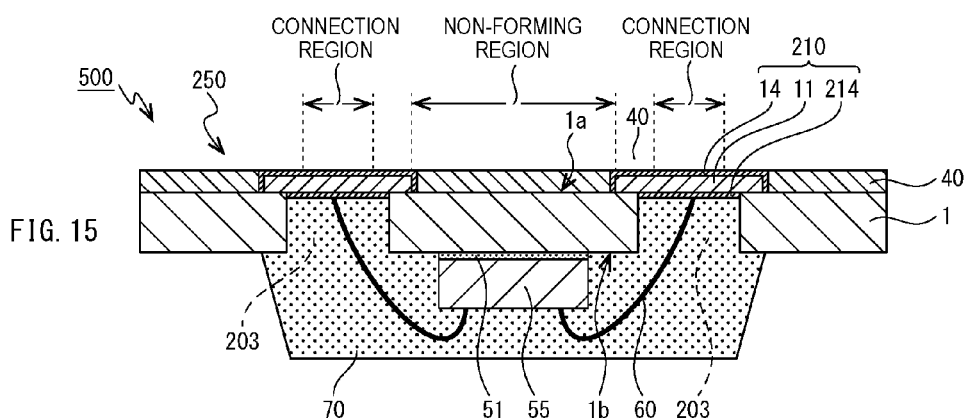
FIG. 15 is a cross-sectional view illustrating a configuration example of an IC module 500 according to the third embodiment.

FIG. 15 is a cross-sectional view illustrating a configuration example of an IC module 500 according to the third embodiment of the present invention. As illustrated in FIG. 15, the IC module 500 includes the IC module substrate 450, an IC chip 55 attached to an IC attaching region of the IC module substrate 450 via an adhesive 51, wires 60 electrically joining the IC chip 55 and the contact terminals 210 to each other, and a sealing member 70 sealing the IC chip 55 and the wires 60.

Figure 16:
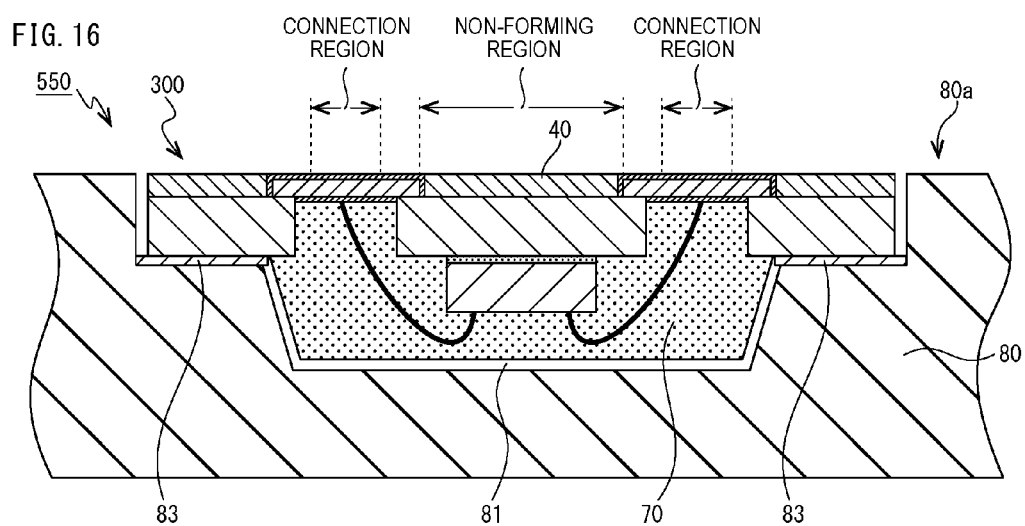
FIG. 16 is a cross-sectional view illustrating a configuration example of an IC card 550 according to the third embodiment.

FIG. 16 is a cross-sectional view illustrating a configuration example of an IC card 550 according to the third embodiment of the present invention. As illustrated in FIG. 16, the IC card 550 is, for example, a contact-type IC card and includes a card base member 80 having a recess 81 on its card surface 80a and the IC module 500 embedded in the recess 81. In this example, the IC module 500 is disposed in the recess 81 in the state where its back surface side (i.e. the side having the sealing member 70) faces the card base member 80, and an outer peripheral portion of the IC module 500 is bonded and fixed to a bottom surface of the recess 81 via an adhesive 83.

(Manufacturing Method)

Figure 17A:
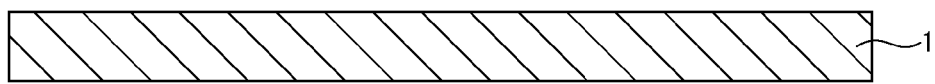
FIGS. 17A to 17D are cross-sectional views illustrating a manufacturing method of the IC module 500 in the order of processes.
Figure 17B:
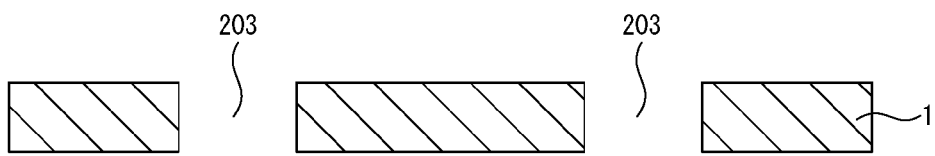
Figure 17C:
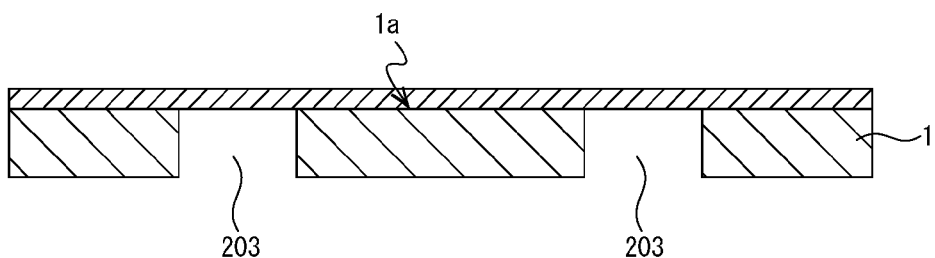

FIGS. 17A to 19C are cross-sectional views illustrating, in the order of processes, a manufacturing method of the IC module 500 according to the third embodiment of the present invention. As illustrated in FIG. 17A, first, a base member 1 is prepared. Then, as illustrated in FIG. 17B, bonding holes 203 being through holes are formed in the base member 1. Then, as illustrated in FIG. 17C, a copper foil 11 is bonded to a front surface 1a of the base member 1. The bonding of the copper foil 11 is carried out using, for example, a non-illustrated adhesive.

Figure 17D:
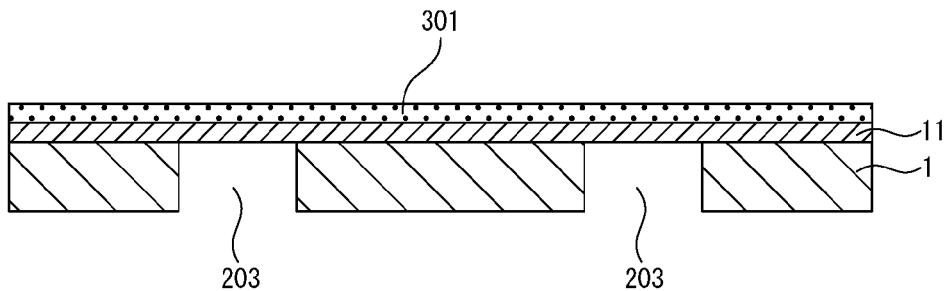
Figure 18A:
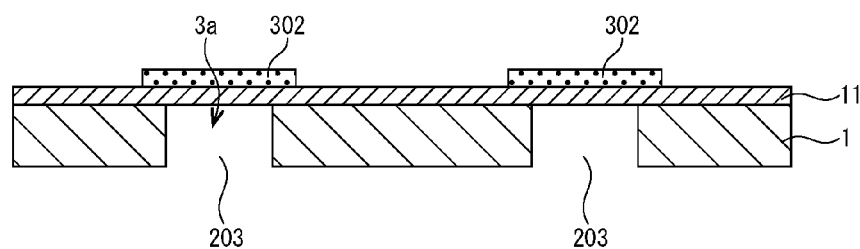
FIGS. 18A to 18C are cross-sectional views illustrating the manufacturing method of the IC module 500 in the order of processes.

Then, as illustrated in FIG. 17D, a photoresist 301 is applied to the copper foil 11. Then, the photoresist 301 is patterned by exposure and development techniques, thereby forming a resist pattern 302 as illustrated in FIG. 18A. The resist pattern 302 has, for example, a shape that covers regions where contact terminals are to be formed (including upper opening ends 3a of the bonding holes 203) and that exposes the other regions (e.g. a non-forming region).

Figure 18B:
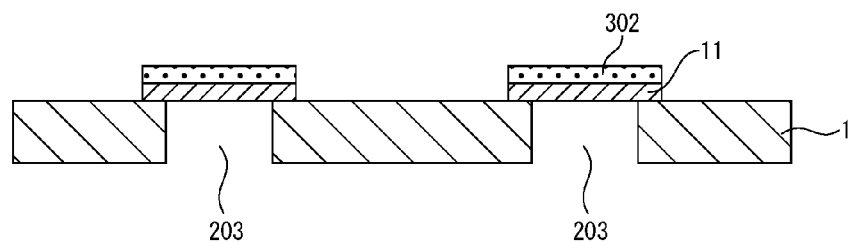
Figure 18C:
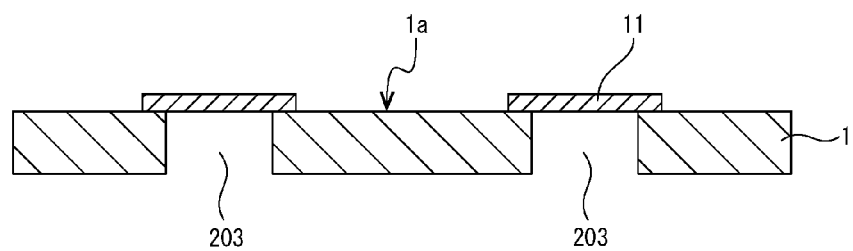

Then, the copper foil 11 is etched using the resist pattern 302 as a mask. Consequently, as illustrated in FIG. 18B, the copper foil 11 is left in regions where contact terminals are to be formed, while the copper foil 11 is removed in the other regions, thereby exposing the base member 1. Thereafter, as illustrated in FIG. 18C, the resist pattern is removed from the copper foil 11.

Figure 19A:
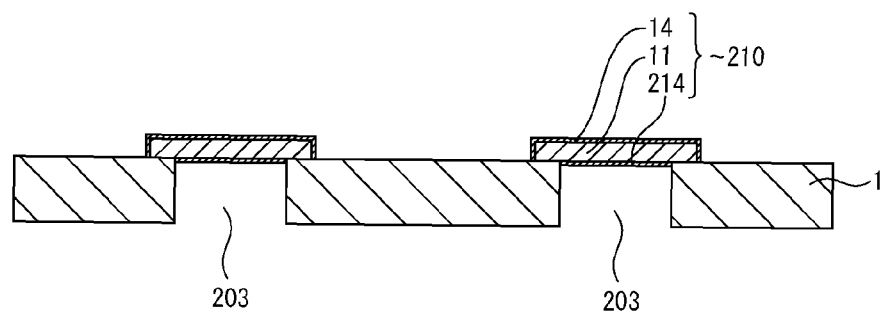
FIGS. 19A to 19C are cross-sectional views illustrating the manufacturing method of the IC module 500 in the order of processes.
Figure 19B:
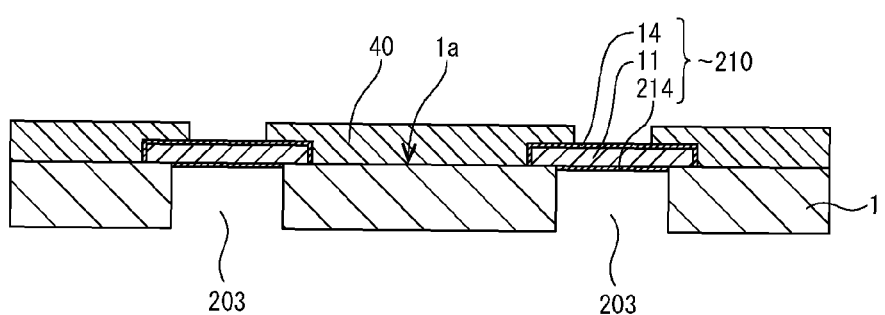

Then, as illustrated in FIG. 19A, a non-illustrated nickel plating layer and gold plating layers 14 and 214 are formed on a front surface of the copper foil 11, a back surface (exposed through the bonding holes 203) of the copper foil 11, and side surfaces of the copper foil 11 by electroplating. In this way, contact terminals 210 are formed. Then, as illustrated in FIG. 19B, a surface material 40 is formed on the front surface 1a of the base member 1. A forming method of the surface material 40 is, for example, printing (offset printing, screen printing), vapor deposition, or the like. A transparent layer may be formed as a protective member on the surface material 40. Through the processes described above, the IC module substrate 450 illustrated in FIG. 14 is completed.

Figure 19C:
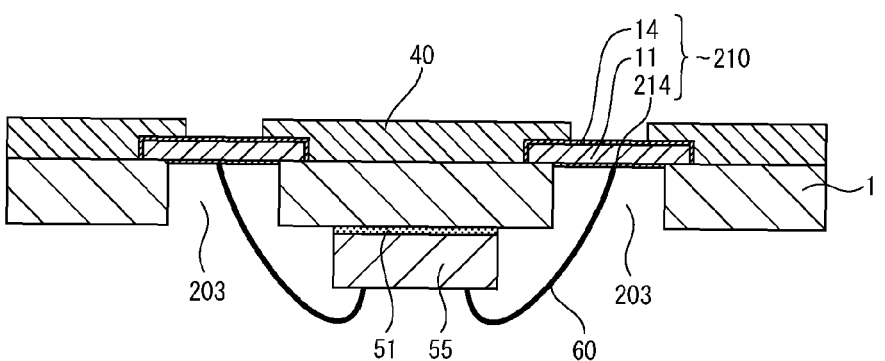

Then, as illustrated in FIG. 19C, an IC chip 55 is attached to an IC attaching region of the IC module substrate 450 using an adhesive 51 such as an Ag paste (mounting process). After the mounting process, one end of each wire 60 is joined to a pad electrode of the IC chip 55 and the other end of each wire 60 is joined to the gold plating layer 214 through the bonding hole 203, thereby electrically connecting the IC chip 55 and the contact terminals 210 to each other (wire bonding process). After the wire bonding process, a sealing member is formed on the back surface 1b side of the base member 1, thereby sealing the IC chip 55 and the wires 60 (sealing process). Through the processes described above, the IC module 500 illustrated in FIG. 15 is completed.

Manufacturing processes of an IC card are the same as those in the first embodiment. That is, the IC module 500 is embedded in a recess 81 of a card base member 80. This embedding is carried out using, for example, a pickup device or the like. Through the processes described above, the IC card 550 illustrated in FIG. 16 is completed.

In the third embodiment, the wire 60 corresponds to a conductive member of the present invention. The other correspondence relationship is the same as that in the first embodiment.

Effects of Third Embodiment

The third embodiment exhibits the same effects as the effects (1) to (3) of the first embodiment.

Fourth Embodiment

In the third embodiment described above, the description is given of the case where the single-sided copper foil base member is used and where the side surfaces of the contact terminal are formed of the noble metal plating layer. However, the present invention is not limited thereto. As in the case where the double-sided copper foil base member is used, the side surfaces of the contact terminal may be, for example, the base material (e.g. copper) of the contact terminal. This point will be described in a fourth embodiment.

(Configuration)

FIG. 20 is a cross-sectional view illustrating a configuration example of an IC module substrate 650 according to the fourth embodiment of the present invention. FIG. 21 is a cross-sectional view illustrating a configuration example of an IC module 700 according to the fourth embodiment of the present invention. FIG. 22 is a cross-sectional view illustrating a configuration example of an IC card 750 according to the fourth embodiment of the present invention.

As illustrated in FIGS. 20 to 22, the IC module substrate 650, the IC module 700, and the IC card 750 according to the fourth embodiment differ from the IC module substrate 450, the IC module 500, and the IC card 550 according to the third embodiment in that side surfaces 210a and 210b of a contact terminal 210 are exposed from a noble metal plating layer. For example, the side surfaces 210a and 210b of the contact terminal 210 are not a gold plating layer 14, but are side surfaces of a copper foil 11 and are made of copper. These side surfaces 210a and 210b made of copper are covered with a surface material 40. The other structures of the fourth embodiment are the same as those of the third embodiment.

(Manufacturing Method)

Figure 23A:
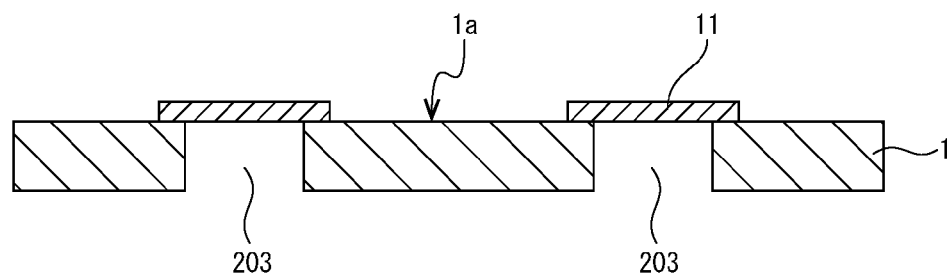
FIGS. 23A to 23C are cross-sectional views illustrating a manufacturing method of the IC module 700 in the order of processes.

FIGS. 23 and 24 are cross-sectional views illustrating, in the order of processes, a manufacturing method of the IC module 700 according to the fourth embodiment of the present invention. As illustrated in FIG. 23A, processes up to processes of partially etching a copper plating layer 12 and a copper foil 11 and removing a resist thereafter are the same as those in the third embodiment.

Figure 23B:
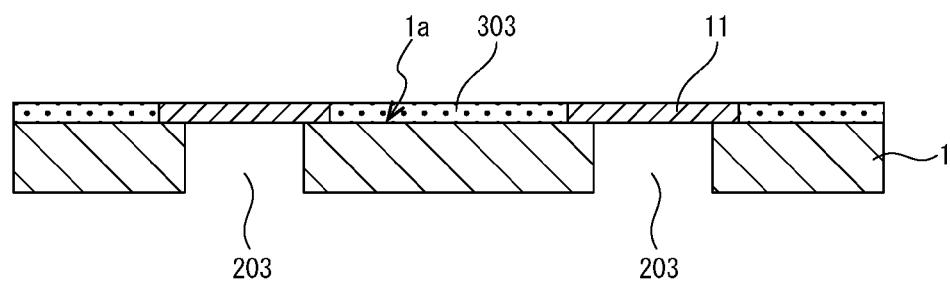

Then, as illustrated in FIG. 23B, a resist pattern 303 is formed in regions, exposed from the copper foil 11, of a front surface 1a of a base member 1. A forming method of the resist pattern 303 is, for example, printing (offset printing, screen printing) of a resist material or application of a resist material and exposure and development techniques.

Figure 23C:
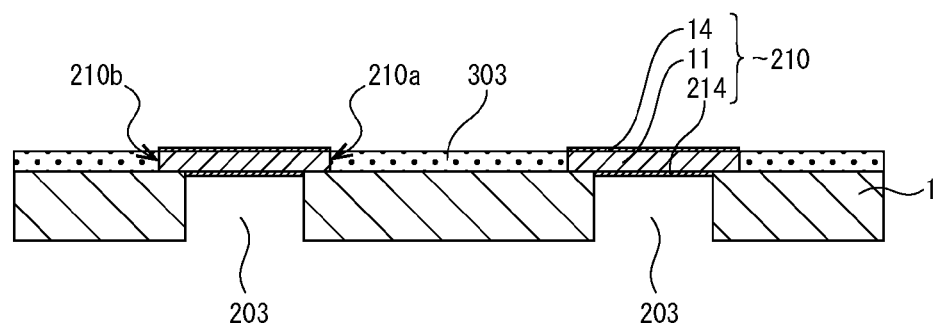
Figure 24A:
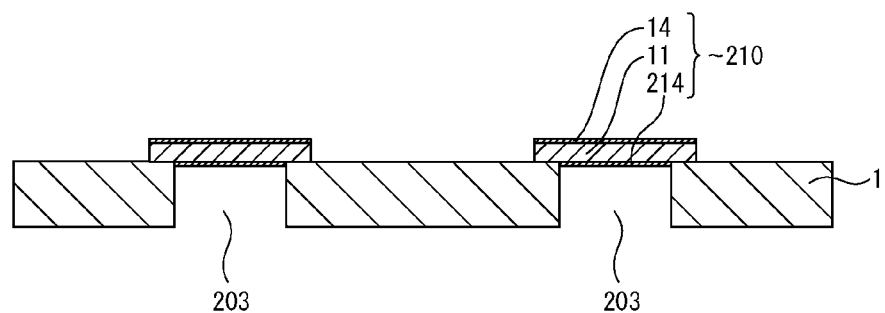
FIG. 24A to 24C are cross-sectional views illustrating the manufacturing method of the IC module 700 in the order of processes.

Then, a nickel plating layer and a gold plating layer 14 are formed by, for example, electroplating. As illustrated in FIG. 23C, since side surfaces 210a and 210b of contact terminals 210 are covered with the resist pattern 303, the nickel plating layer or the gold plating layer 14 is not formed on the side surfaces 20a and 20b. That is, the side surfaces 20a and 20b are made of copper. Then, as illustrated in FIG. 24A, the resist 303 is removed from the base member 1.

Figure 24B:
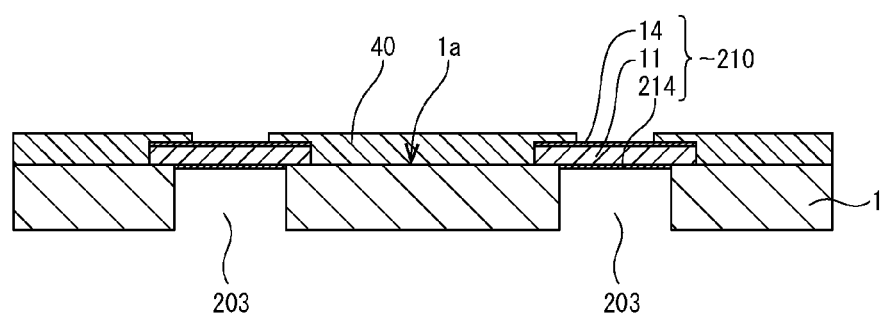
Figure 24C:
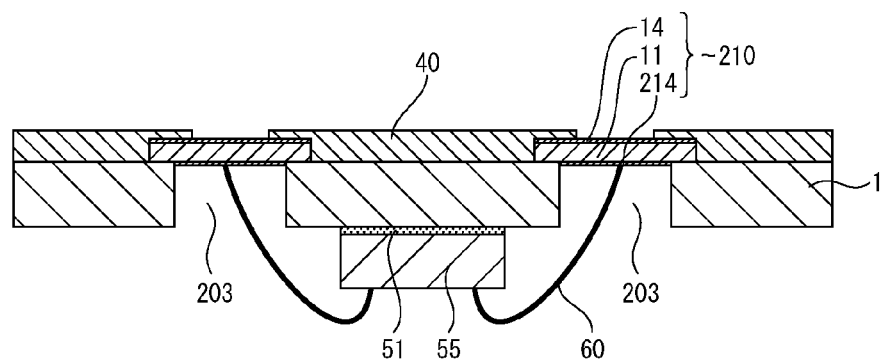
Figure 25:
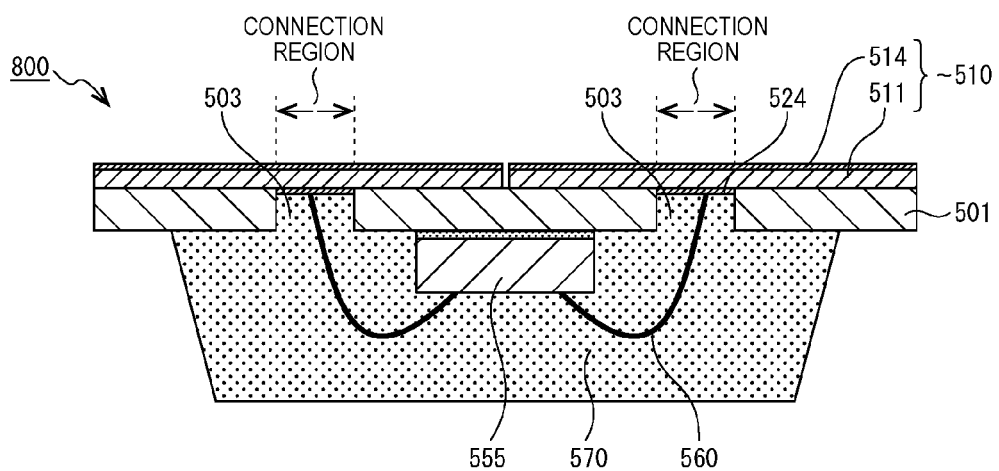
FIG. 25 is a cross-sectional view illustrating a configuration example of an IC module 800 according to a prior art.

Then, subsequent processes are the same as those in the third embodiment. That is, as illustrated in FIG. 24B, an insulating surface material 40 is applied to a surface 1a of the base member 1. Consequently, the IC module substrate 650 illustrated in FIG. 20 is completed. Then, as illustrated in FIG. 24C, a mounting process of an IC chip 55, a wire bonding process, and a sealing process are carried out in this order. Through the processes described above, the IC module 700 illustrated in FIG. 21 is completed.

The correspondence relationship with the present invention in the fourth embodiment is the same as that in the third embodiment.

Effects of Fourth Embodiment

The fourth embodiment of the present invention exhibits the same effects as the effects (1) and (3) of the first embodiment.

In the fourth embodiment, the surface material 40 covers the side surfaces 210a and 210b made of, for example, copper. Consequently, the side surfaces 210a and 210b of the contact terminal 210 can be prevented from being exposed to a use environment so that it is possible to prevent the occurrence of rust or the like on the side surfaces 210a and 210b. Therefore, it is possible to enhance the corrosion resistance of the contact terminal 210 and so on.

<Others>

In the embodiments described above, the description is given of the case where an IC module substrate, an IC module, and an IC card are applied to a contact-type IC card. However, the application of the present invention is not limited to the contact type. For example, the present invention may be applied to module structures in general to which IC module structures are applied, such as a hybrid card configured such that a contact IC chip and a non-contact IC chip are mounted in a single card, a dual card configured such that a single IC chip functions as both a contact type and a non-contact type, and an electromagnetic coupling dual card provided with an antenna coil and so on in a dual card. Even in such cases, the effects of the embodiments are exhibited.

The entire contents of Japanese Patent Application No. 2013-219361 (filed on Oct. 22, 2013), from which this application claims priority, form part of this disclosure by reference.

While the description has been given herein referring to a limited number of embodiments, the scope of rights is not limited thereto. Modifications of the embodiments based on the foregoing disclosure are apparent to those skilled in the art. That is, the present invention is not limited to the embodiments described above. It is possible to add design changes and so on to the embodiments based on the knowledge of those skilled in the art and the aspects added with such changes and so on are also included in the scope of the present invention.

REFERENCE SIGNS LIST

1 BASE MEMBER
1a FRONT SURFACE
1b BACK SURFACE
2 DOUBLE-SIDED COPPER FOIL BASE MEMBER
3 THROUGH HOLE
3a UPPER OPENING END
3b LOWER OPENING END
10, 210 CONTACT TERMINAL
10a, 20a, 20b, 210a SIDE SURFACE
10c, 210c CONTACT SURFACE
11, 21 COPPER FOIL
12 COPPER PLATING LAYER
14, 214 GOLD PLATING LAYER
20 FIRST CONDUCTIVE LAYER
20a, 20b SIDE SURFACE
30 SECOND CONDUCTIVE LAYER
40, 240 SURFACE MATERIAL
50, 250, 450, 650 MODULE SUBSTRATE
51 ADHESIVE
55 IC CHIP
60 WIRE
61 JOINING PORTION
70, 270 SEALING MEMBER
80 CARD BASE MEMBER
80a CARD SURFACE
81 RECESS
83 ADHESIVE
100, 300, 500, 700 IC MODULE
100a OUTER PERIPHERAL SECTION (SIDE SURFACE)
101, 301 PHOTORESIST
102, 103, 112, 113, 302, 303 RESIST PATTERN
150, 350, 550, 750 IC CARD
203 BONDING HOLE

The invention claimed is:

1. An IC module characterized by comprising:
   a base member provided with a through hole that is opened at a front surface and a back surface;
   a contact terminal provided on the front surface and configured such that at least a part of a contact surface for contact with an external terminal is formed of a noble metal plating layer;
   an IC chip attached to the back surface at a position that does not overlap the through hole in plan view;
   a conductive member connecting the IC chip and the contact terminal to each other through the through hole; and
   an insulating surface material partially covering the front surface,
   wherein at least a part of a region, overlapping the IC chip in plan view, of the front surface is set as a non-forming region where the noble metal plating layer is not formed, and the surface material is disposed in the non-forming region.

2. The IC module according to claim 1, characterized in that a side surface of the contact terminal is formed of the noble metal plating layer.

3. The IC module according to claim 1, characterized in that the surface material covers a side surface of the contact terminal.

4. The IC module according to claim 1, characterized in that a color of the surface material is different from a color of the noble metal plating layer.

5. The IC module according to claim 1, characterized in that the conductive member comprises:
   a first conductive layer provided on the back surface of the base member;
   a second conductive layer provided on an inner wall of the through hole and connecting the first conductive layer and the contact terminal to each other; and
   a conductive path having one end connected to the IC chip and another end connected to the first conductive layer.

6. An IC card characterized by comprising:
   a card base member having a recess on one surface thereof; and
   an IC module embedded in the recess,
   the IC module comprising:
   a base member provided with a through hole that is opened at a front surface and a back surface;
   a contact terminal provided on the front surface and configured such that at least a part of a contact surface for contact with an external terminal is formed of a noble metal plating layer;
   an IC chip attached to the back surface at a position that does not overlap the through hole in plan view;
   a conductive member connecting the IC chip and the contact terminal to each other through the through hole; and
   an insulating surface material partially covering the front surface,
   wherein at least a part of a region, overlapping the IC chip in plan view, of the front surface is set as a non-forming region where the noble metal plating layer is not formed, and the surface material is disposed in the non-forming region.

7. An IC module substrate characterized by comprising:
a base member provided with a through hole that is opened at a front surface and a back surface;
a contact terminal provided on the front surface and configured such that at least a part of a contact surface for contact with an external terminal is formed of a noble metal plating layer; and
an insulating surface material partially covering the front surface,
wherein an IC attaching region for attaching an IC chip is set in a region, that does not overlap the through hole in plan view, of the back surface, and
wherein at least a part of a region, overlapping the IC attaching region in plan view, of the front surface is set as a non-forming region where the noble metal plating layer is not formed, and the surface material is disposed in the non-forming region.

\* \* \* \* \*